United States Patent
Berezin et al.

(10) Patent No.: US 6,239,456 B1
(45) Date of Patent: May 29, 2001

(54) LOCK IN PINNED PHOTODIODE PHOTODETECTOR

(75) Inventors: Vladimir Berezin, La Crescenta; Alexander Krymski, Montrose; Eric R. Fossum, LaCrescenta, all of CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/378,565

(22) Filed: Aug. 19, 1999

Related U.S. Application Data

(60) Provisional application No. 60/097,135, filed on Aug. 19, 1998.

(51) Int. Cl.[7] .................. H01L 31/062; H01L 31/113
(52) U.S. Cl. .................. 257/232; 257/233; 257/291; 257/292; 257/458; 257/461; 438/66; 375/238; 341/145; 250/370.1
(58) Field of Search .................. 257/232, 233, 257/291, 292, 458, 461; 438/66; 375/238; 341/145; 250/370.1

(56) References Cited

U.S. PATENT DOCUMENTS

| | | | |
|---|---|---|---|
| 5,471,505 | * 11/1995 | Birangi et al. | 375/238 |
| 5,880,495 | * 3/1999 | Chen | 257/233 |
| 5,904,493 | * 5/1999 | Lee et al. | 438/57 |
| 6,084,259 | * 7/2000 | Kwon et al. | 257/292 |
| 6,100,551 | * 8/2000 | Lee et al. | 257/232 |
| 6,127,697 | * 10/2000 | Guidash | 257/292 |

* cited by examiner

Primary Examiner—William Mintel
(74) Attorney, Agent, or Firm—Fish & Richardson P.C.

(57) ABSTRACT

A lock in pinned photodiode photodetector includes a plurality of output ports which are sequentially enabled. Each time when the output port is enabled is considered to be a different bin of time. A specified pattern is sent, and the output bins are investigated to look for that pattern. The time when the pattern is received indicates the time of flight.

12 Claims, 4 Drawing Sheets

LOCK IN PINNED PHOTODIODE PHOTODETECTOR

CROSS REFERENCE TO RELATED APPLICATIONS

This application claims the benefit of the U.S. Provisional Application Nos. 60/097,135, filed on Aug. 19, 1998, which is incorporated herein by reference.

BACKGROUND

Certain applications require measuring aspects that are based on the speed of light.

For example, range finding can be carried out using optics. An optical signal is sent. The reflection therefrom is received. The time that it takes to receive the reflection of the optical signal gives an indication of the distance.

The so called lock-in technique uses an encoded temporal pattern as a signal reference. The device locks into the received signal to find the time of receipt. However, noise can mask the temporal pattern.

A lock in photodetector based on charged coupled devices or CCDs has been described in Miagawa and Kanada "CCD based range finding sensor" IEEE Transactions on Electronic Devices, volume 44 pages 1648–1652 1997.

CCDs are well known to have relatively large power consumption.

SUMMARY

The present application describes a special kind of lock in detector formed using CMOS technology. More specifically, a lock in detector is formed from a pinned photodiode. The photodiode is modified to enable faster operation.

It is advantageous to obtain as much readout as possible to maximize the signal to noise ratio. The pinned photodiode provides virtually complete charge transfer readout.

Fast separation of the photo-generated carriers is obtained by separating the diode into smaller sub-parts and summing the output values of the subparts to obtain an increased composite signal.

BRIEF DESCRIPTION OF THE DRAWINGS

These an other aspects will now be described in detail with reference to the accompanying drawings, wherein.

DESCRIPTION OF THE PREFERRED EMBODIMENT

The present application uses a special, multiple output port pinned photodiode as the lock in pixel element. The photodiode is preferably part of a CMOS active pixel image sensor, of the type described in U.S. Pat. No. 5,471,505. Hence, the system preferably includes in-pixel buffer transistors and selection transistors, in addition to the CMOS photodetector.

Figure 1:
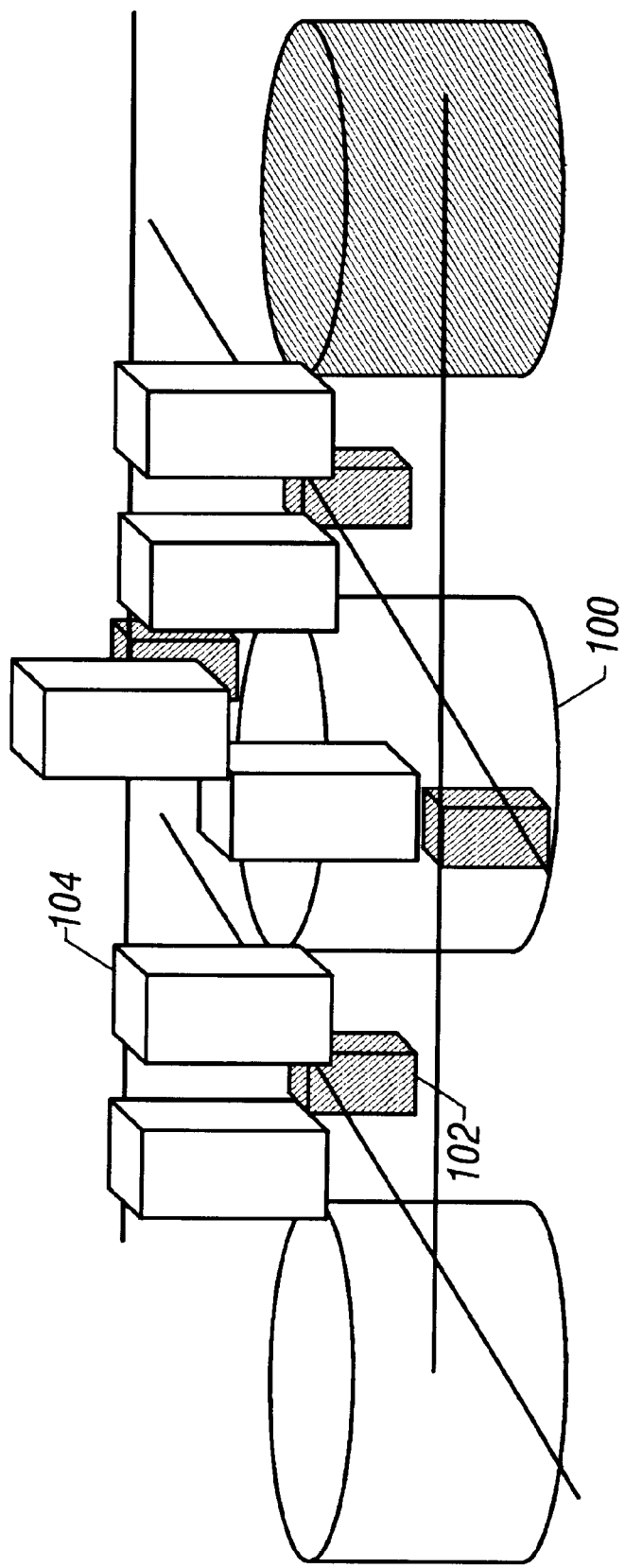
FIG. 1 shows a basic block diagram of the system.

FIG. 1 shows a pinned photodiode with four output ports, labeled as out1-out4. Each of the output ports is used to receive a reflection for a specified time duration. Each output becomes a "bin". The counting of the amount of information in the bins enables determination of the reflection time, and hence the range.

Pinned photodiodes are well known in the art and described in U.S. Pat. No. 5,904,493. A pinned photodiode is also known as a hole accumulation diode or HAD, or a virtual phase diode or VP diode. Advantages of these devices are well known in the art. They have small dark current due to suppression of surface generation. They have good quantum efficiency since there are few or no polysilicon gates over the photosensitive region. Pinned photodiodes can also be made into smaller pixels because they have fewer gates.

The basic structure of the pinned photodiode lock in pixel is shown in FIG. 1. Four switched integrators are formed respectively at four output ports. Each gate is enabled during a specified period. The different integrators integrate carriers accumulated during the different periods. The first integrator accumulates carriers between 0 and $\pi/2$, the second between $\pi/2$ and $\pi$, the third between $\pi$ and $3\pi/2$ and the fourth between $3\pi/2$ and $2\pi$ time slots.

Assuming the light to be a cosine phase, then the phase shift of the detected light is given by $\arctan[(L1-L3)/(L2-L4)]$, where L1, L2, L3 and L4 are the amplititudes of the samples from the respective first, second, third and fourth integrators. These four phases are obtained from the four outputs of the photodiode.

The first pinned photodiode 100 is connected to an output drain 102 via gate 1, element 104. This receives the charge for the first bin. Similarly, gates 2, 3 and 4 are turned on to integrate/bin from the second, third and fourth periods.

It is important to obtain as much signal as possible from the photodiode. This can be done by using a large photodiode. However, it can take the electrons a relatively long time to escape from a large photodetector.

Figure 2:
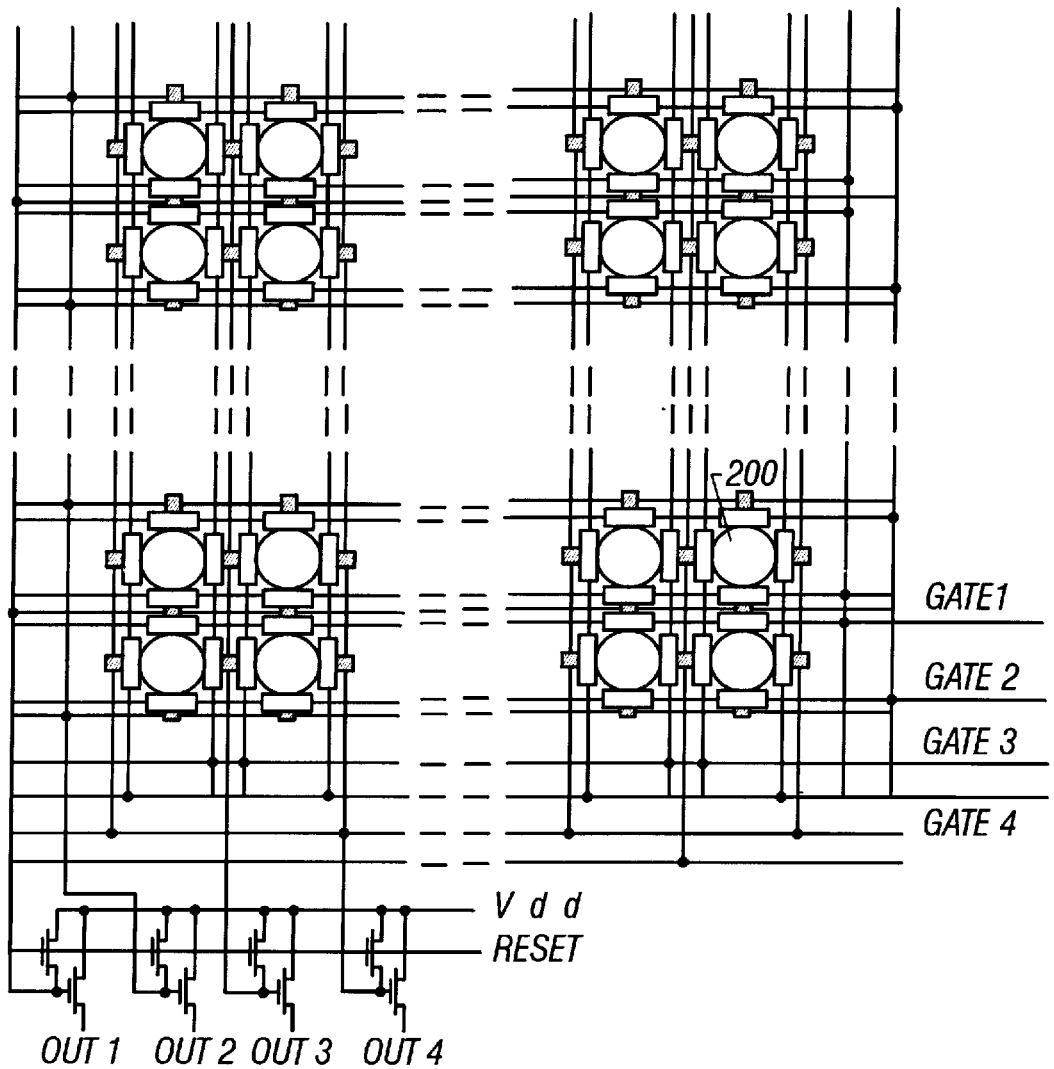
FIG. 2 shows a block diagram of the multiple photodiode parts.

The present system divides the one larger photodiode into a number of smaller diodes, each with multiple output ports. FIG. 2 shows the system.

A number of subpixels are formed. Each includes a number of pinned photodiodes 200, each with four ports. Each of the corresponding ports are connected together in a way that allows summing the outputs of the photodiodes. For example, all the gate 1 control lines are connected together as shown. The outputs from all the port 1s are also summed, and output as a simple composite output. Similarly, ports 2, 3 and 4's are all summed.

Figure 3:
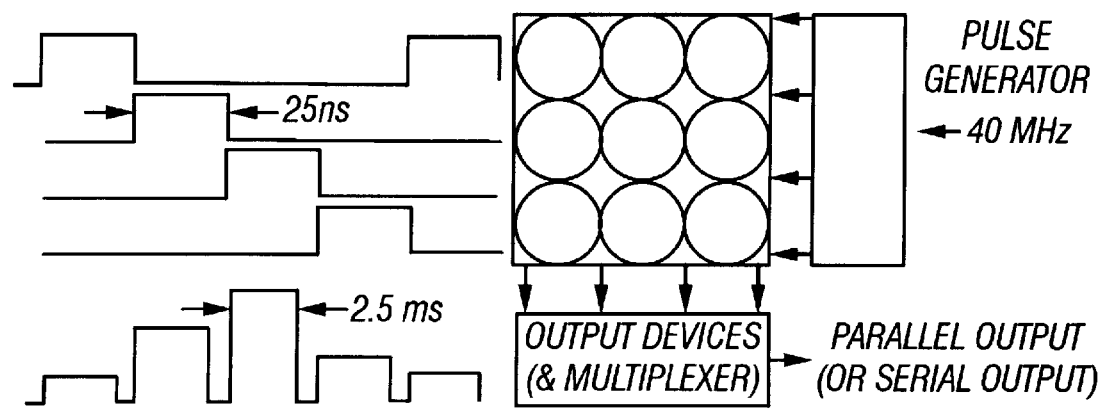
FIG. 3 shows a block diagram of the system as used in range finding.

FIG. 3 shows the circuit and driving waveforms for the system when used as a range finder. A pulse generator drives selection of the active output. Each time period is separately accumulated, and output. If a 40 MHZ pulse generator is used, 25 ns resolution can be obtained.

Figure 4A:
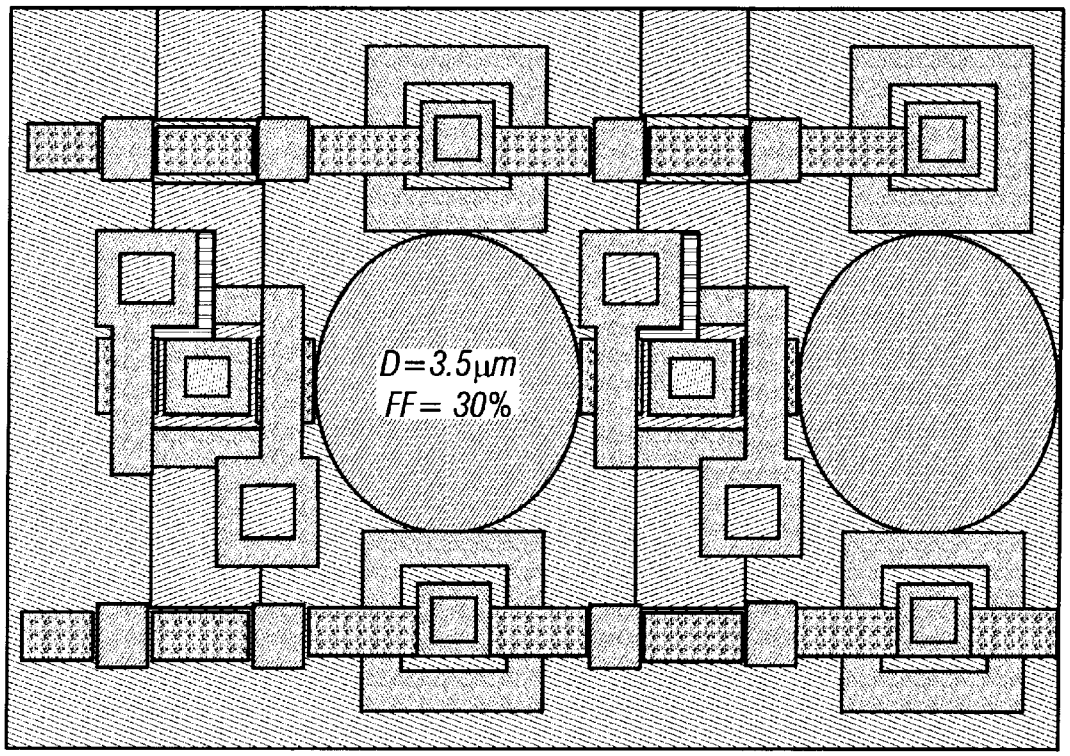
FIG. 4a and 4b show pixel layouts.
Figure 4B:
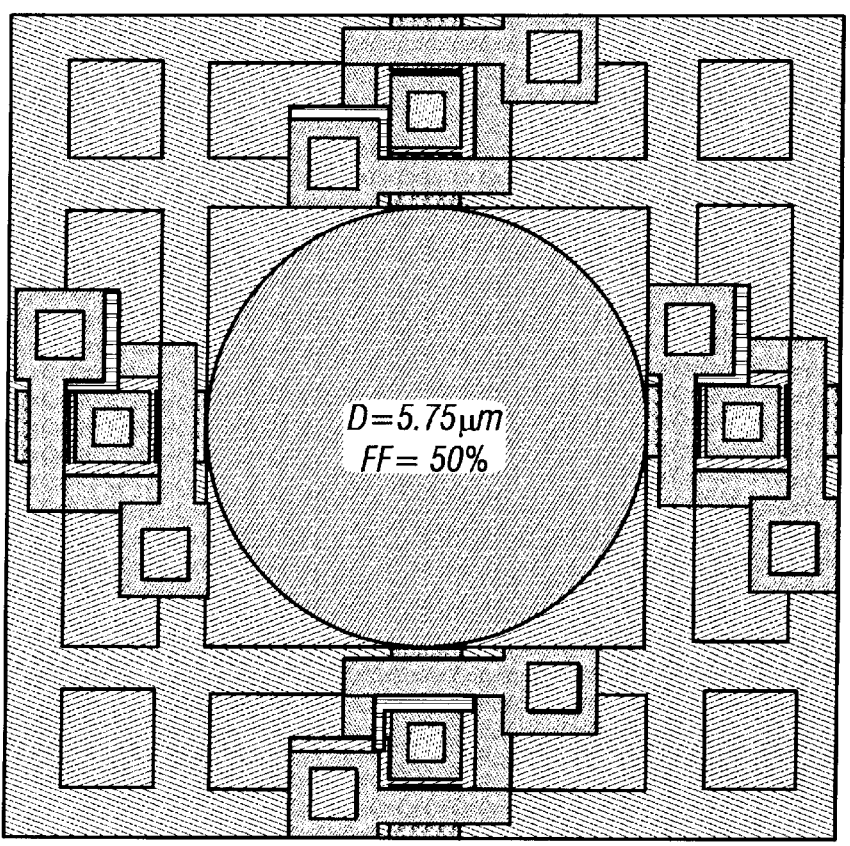

FIG. 4A and 4B show representative pixel layouts. FIG. 4A shows a 6 by 6 square micron pixel layout while FIG. 4B shows an 8½ by 8½ micron pixel layout. In both Figures, four outputs are shown.

Figure 5:
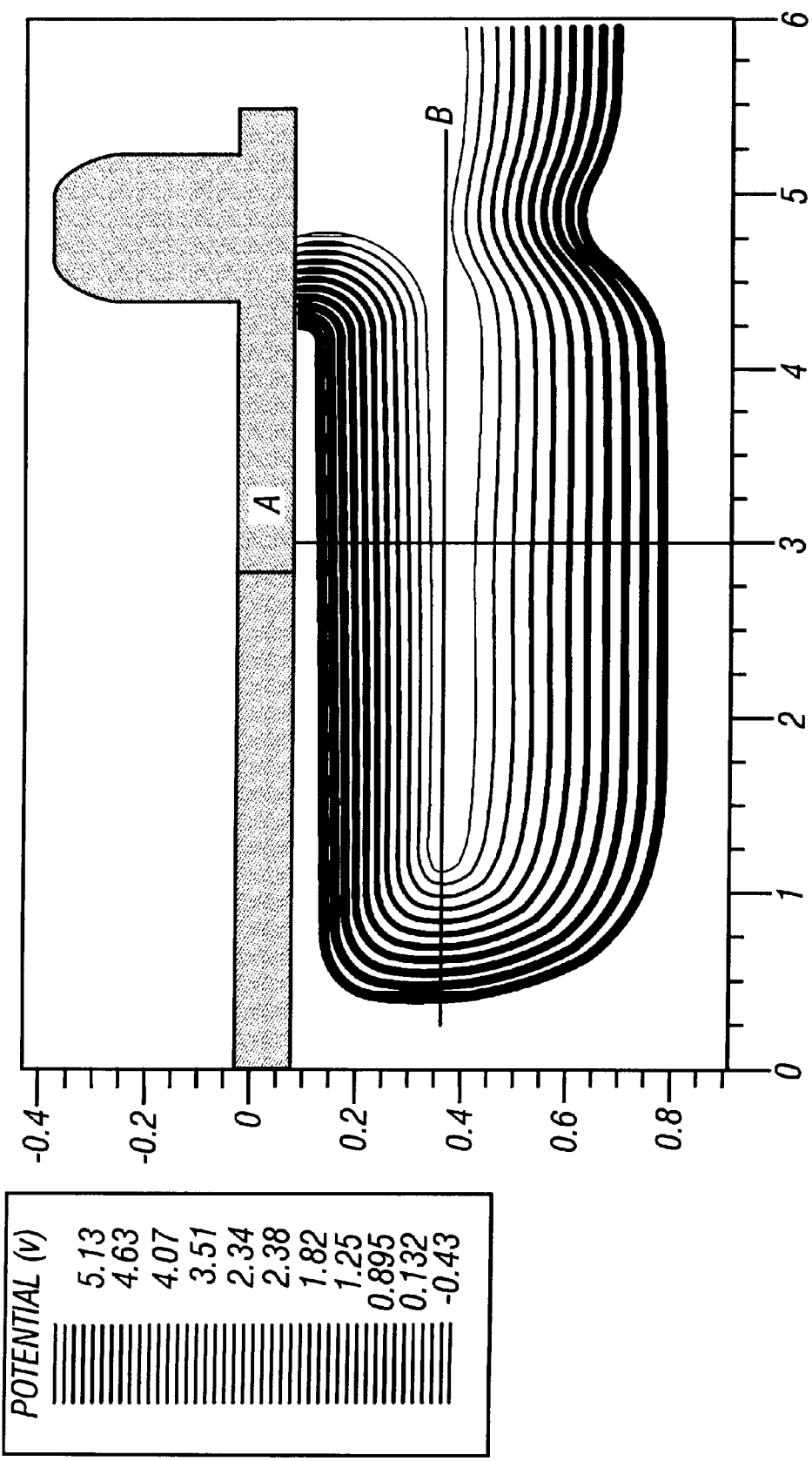
FIG. 5 shows a cross section of the pinned photodiode.
Figure 1:
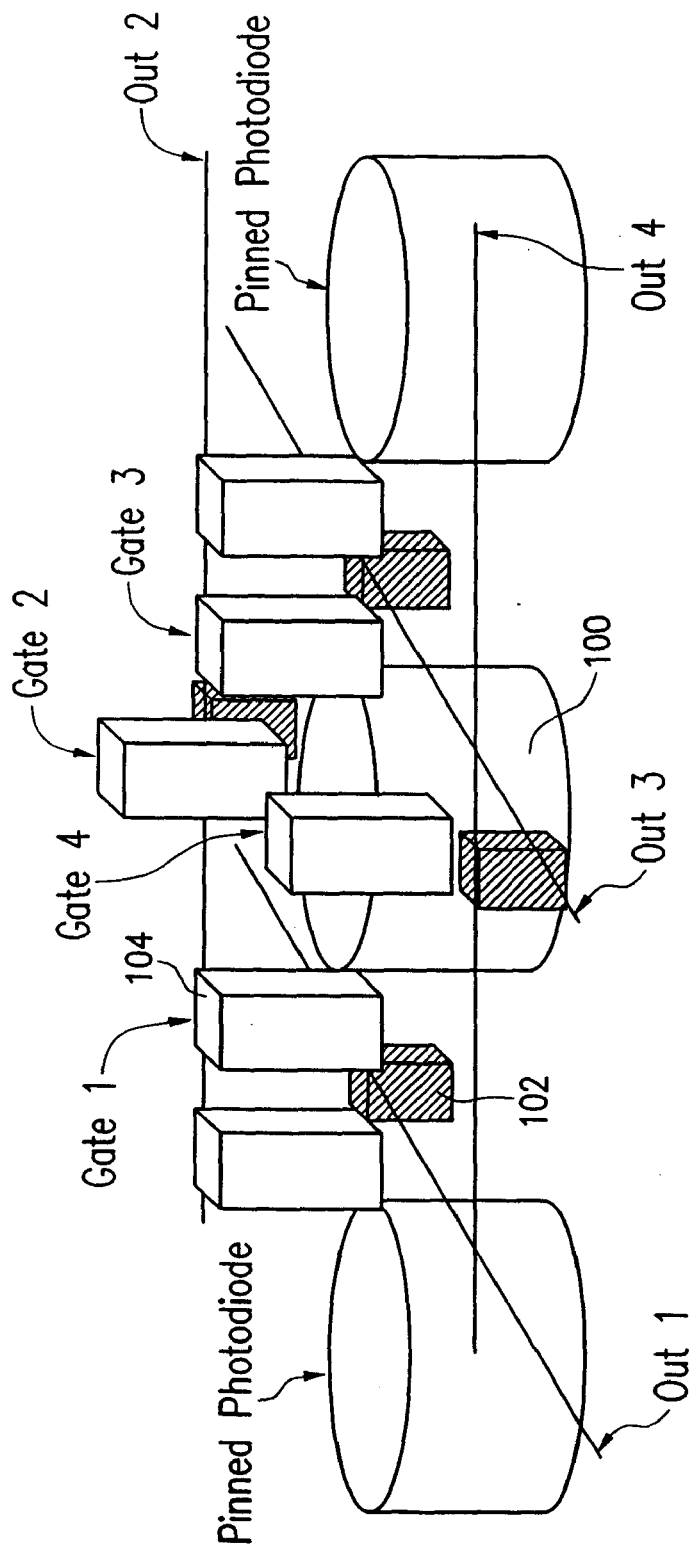

FIG. 5 shows a cross sectional potential diagram of an exemplary pinned photodiode.

Assuming the operation frequency of modulated light is 10 megahertz with a 25 nanosecond integration slot, the generator carrier has a time of flight within this limit. This resolution time constrains the size of the detector. In addition, the characteristic diffusion time in a semiconductor device is $L^2/D$, where D is the diffusion coefficient. This time originates from the continuity equation and the diffusion equation, and defines how soon the steady state will be established in the area of size L. Hence, for a 10 cm square per second electron diffusion coefficient, the characteristic size of the pinned photodiode could be less than 5 microns.

Other embodiments are also contemplated to exist within this disclosure. For example, other numbers of output ports, e.g. 2–8, are possible. While this application describes using a pinned photodiode, similar operations could be carried out with other CMOS photodetectors, e.g., photodiodes and photogates.

Such modifications are intended to be encompassed within the following claims.

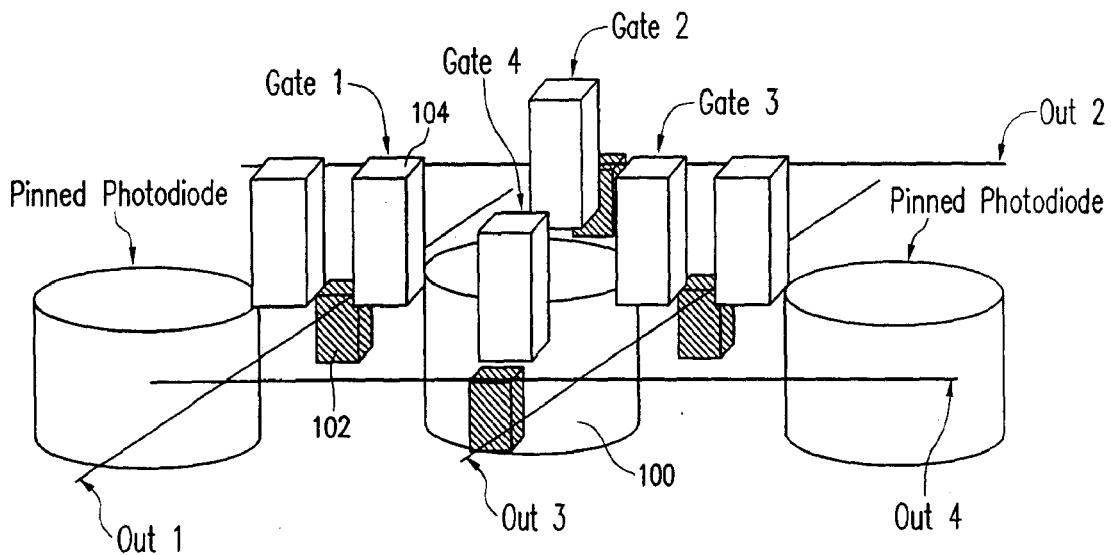

What is claimed:

1. A semiconductor, comprising:

a multiple port pinned photodiode including a pinned photodiode section, which is light sensitive and which accumulates an indication of incoming light therein, said pinned photodiode including a plurality of output ports, and a plurality of gates, each output port controlled by a gate, and including at least a first output port on said pinned photodiode controlled by a first gate and a second port controlled by a second gate.

2. A semiconductor as in claim 1 wherein said pinned photodiode is formed of CMOS.

3. A semiconductor as in claim 1 wherein there are four output ports and four of said gates associated with said pinned photodiode.

4. A semiconductor as in claim 1 further comprising a plurality of additional pinned photodiodes, each having said plurality of output ports, and wherein each output port of each of said photodiodes is connected to a corresponding output port of another of said photodiodes.

5. A semiconductor as in claim 4 further comprising a plurality of gates for said plurality of additional photodiodes, at least a plurality of said gates being connected together.

6. A semiconductor as in claim 5 wherein there are four of said output ports on each of said pinned photodiodes.

7. A semiconductor as in claim 1, further comprising a pulse generator, periodically producing pulses which change a currently-selected gate.

8. A photodiode system, comprising:

a plurality of pinned photodiode photodetectors, each having a plurality of output ports, and at least a plurality of which output ports are connected to corresponding output ports of other photodetectors to produce a plurality of outputs, each of which corresponds to a summed output from said photodetectors.

9. A system as in claim 8 further comprising a plurality of gates which are commonly connected to commonly select a number of outputs, and wherein said outputs are commonly connected.

10. A system as in claim 9 further comprising a selection generator, producing a selection signal which selects a first of said gates at a first time and a second of said gates at a second time to thereby characterize the output signal according to a time it was produced.

11. A method of detecting a time of flight, comprising:

sending a specified pattern to a reflecting object;

receiving reflections from the object in a pinned photodiode which has multiple output ports;

receiving an output from a different one of the multiple output ports at different times; and using the output port which receives at the specified time to determine the time of flight.

12. A method as in claim 11, wherein said receiving comprises receiving said reflections into a plurality of pinned photodiodes having outputs that are connected together.

* * * * *

UNITED STATES PATENT AND TRADEMARK OFFICE
CERTIFICATE OF CORRECTION

| | | |
|---|---|---|
| PATENT NO. | : 6,239,456 B1 | Page 1 of 3 |
| APPLICATION NO. | : 09/378565 | |
| DATED | : May 29, 2001 | |
| INVENTOR(S) | : Vladimir Berezin et al. | |

It is certified that error appears in the above-identified patent and that said Letters Patent is hereby corrected as shown below:

The title page, showing an illustrative figure, should be deleted and substitute therefor the attached title page Delete Drawing Sheet 1 and substitute therefor the Drawing Sheet consisting of FIG 1 as shown on the attached page.

In the Specification, the following errors are corrected:

Column 1, line 45, "an" should read --and--; and

Column 2, line 47, "4's" should read --4s--.

Signed and Sealed this

Third Day of October, 2006

JON W. DUDAS
*Director of the United States Patent and Trademark Office*

United States Patent
Berezin et al.

(12)

(10) Patent No.: US 6,239,456 B1
(45) Date of Patent: May 29, 2001

(54) LOCK IN PINNED PHOTODIODE PHOTODETECTOR

(75) Inventors: Vladimir Berezin, La Crescenta; Alexander Krymski, Montrose; Eric R. Fossum, LaCrescenta, all of CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/378,565

(22) Filed: Aug. 19, 1999

Related U.S. Application Data

(60) Provisional application No. 60/097,135, filed on Aug. 19, 1998.

(51) Int. Cl.$^7$ ..................... H01L 31/062; H01L 31/113
(52) U.S. Cl. ............... 257/232; 257/233; 257/291; 257/292; 257/458; 257/461; 438/66; 375/238; 341/145; 250/370.1
(58) Field of Search .................. 257/232, 233, 257/291, 292, 458, 461; 438/66; 375/238; 341/145; 250/370.1

(56) References Cited

U.S. PATENT DOCUMENTS

| | | | |
|---|---|---|---|
| 5,471,505 | * 11/1995 | Birangi et al. | 375/238 |
| 5,880,495 | * 3/1999 | Chen | 257/233 |
| 5,904,493 | * 5/1999 | Lee et al. | 438/57 |
| 6,084,259 | * 7/2000 | Kwon et al. | 257/292 |
| 6,100,551 | * 8/2000 | Lee et al. | 257/232 |
| 6,127,697 | * 10/2000 | Guidash | 257/292 |

\* cited by examiner

*Primary Examiner*—William Mintel
(74) *Attorney, Agent, or Firm*—Fish & Richardson P.C.

(57) ABSTRACT

A lock in pinned photodiode photodetector includes a plurality of output ports which are sequentially enabled. Each time when the output port is enabled is considered to be a different bin of time. A specified pattern is sent, and the output bins are investigated to look for that pattern. The time when the pattern is received indicates the time of flight.

12 Claims, 4 Drawing Sheets